United States Patent
Houser et al.

(10) Patent No.: US 6,483,046 B1
(45) Date of Patent: Nov. 19, 2002

(54) CIRCUIT BOARD HAVING BURR FREE CASTELLATED PLATED THROUGH HOLES

(75) Inventors: David E. Houser, Apalachin, NY (US); James M. Larnerd, Binghamton, NY (US); Jeffrey L. Lee, Vestal, NY (US); Francis S. Poch, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/559,018

(22) Filed: Apr. 24, 2000

Related U.S. Application Data

(62) Division of application No. 09/315,428, filed on May 20, 1999, now Pat. No. 6,105,246.

(51) Int. Cl.[7] ............................................. H01R 9/09
(52) U.S. Cl. ................................. 174/266; 174/262
(58) Field of Search ........................ 174/250, 260, 174/262, 266, 52.4; 361/768, 771; 257/774, 739

(56) References Cited

U.S. PATENT DOCUMENTS

| | | | |
|---|---|---|---|
| 3,185,947 A | * | 5/1965 | Freymodsson |
| 3,311,791 A | * | 3/1967 | Larson et al. |
| 3,357,099 A | | 12/1967 | Nagy et al. |
| 3,357,856 A | * | 12/1967 | Ragan et al. |
| 4,288,841 A | * | 9/1981 | Gogal |
| 4,372,046 A | | 2/1983 | Suzuki |
| 4,525,597 A | * | 6/1985 | Abe |
| 4,543,715 A | | 10/1985 | Iadarola et al. |
| 4,572,757 A | | 2/1986 | Spadafora |
| 4,790,894 A | | 12/1988 | Homma et al. |
| 4,821,007 A | * | 4/1989 | Fields et al. |
| 4,852,227 A | | 8/1989 | Burks |
| 4,913,931 A | | 4/1990 | Frederickson |
| 5,069,626 A | | 12/1991 | Patterson et al. |
| 5,140,745 A | | 8/1992 | McKenzie, Jr. |
| 5,434,745 A | | 7/1995 | Shokrgozar et al. |
| 5,499,446 A | | 3/1996 | Murakami |
| 5,499,447 A | | 3/1996 | Murakami |
| 5,570,505 A | | 11/1996 | Downie et al. |
| 6,263,565 B1 | * | 7/2001 | Gotoh et al. |

FOREIGN PATENT DOCUMENTS

| | | |
|---|---|---|
| JP | 5-267847 | 10/1983 |
| JP | 4-148591 | 5/1992 |
| JP | 4-56380 | 9/1992 |

* cited by examiner

*Primary Examiner*—Kamand Cuneo
(74) *Attorney, Agent, or Firm*—Schmeiser, Olsen & Watts; Lawrence R. Fraley

(57) ABSTRACT

The present invention provides a circuit board having burr free castellated plated through holes. In particular, the leading edge of the plated through hole, that tends to produce burr formation during conventional profiling, is removed or pre-profiled to off-set the leading edge of the plated through hole from a surface of the circuit board.

15 Claims, 4 Drawing Sheets

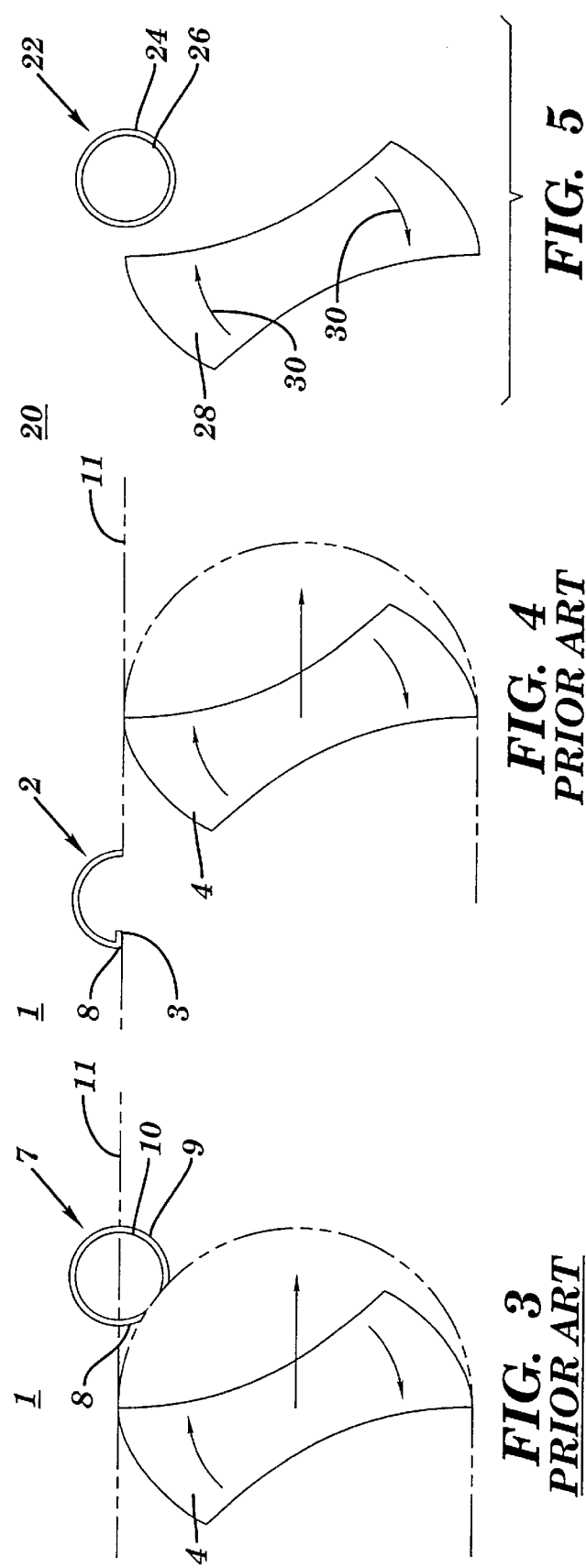

CIRCUIT BOARD HAVING BURR FREE CASTELLATED PLATED THROUGH HOLES

This application is a divisional of Ser. No. 09/315,428, filed on May 20, 1999 now U.S. Pat. No. 6,105,246.

BACKGROUND OF THE INVENTION

1. Technical Field

The present invention relates generally to circuit board technology, and more particularly, to a circuit board wherein a leading edge of the plated through hole is off-set from a surface of the circuit board, to prevent burr formation.

2. Related Art

Castellated plated through holes located at the periphery of a substrate or circuit board are commonly used in circuit technology for various applications. For instance, castellated plated through holes may be used when coupling adjacent circuit boards, thereby providing a solder inspection joint to ensure the solder "wicks up" properly at the interface of the two boards.

Various methods are currently used to create castellated plated through holes at the edges of circuit boards. For instance, a castellated plated through hole may be formed by injection molding, or by cutting, milling, drilling, blanking, etc., the edges of the circuit board. However, as illustrated in FIG. 1, conventional methods tend to produce a circuit board 1, wherein protruding burrs 3 are formed in the castellated plated through holes 2.

FIG. 2 illustrates a prior art profiling tool 4, rotating in the direction indicated by arrows 5, approaching a plated through hole 7 within circuit board 1 from a lateral direction indicated by arrow 6. As shown in FIG. 3, burr formation results when profiling tool 4, moving along a path 11, begins to break through a leading edge 8 of inner hole wall 9. "Leading edge" refers to the first surface or edge of plated through hole 7 contacted by profiling tool 4. Once leading edge 8 of plated through hole 7 has been severed, the only forces available to resist profiling tool 4 are the adhesive forces located between inner hole wall 9 and a layer of copper laminate 10 plated thereon. The heat generated as profiling tool 4 completes the pass through plated through hole 7, causes copper laminate 10 to detach and pull away from inner hole wall 9 at leading edge 8. This occurs because the adhesive forces between copper laminate 10 and inner hole wall 9 at leading edge 8 are not sufficient to hold copper laminate 10 in place. FIG. 4 shows the loose flap of copper laminate at leading edge 8 of plated through hole 7 folded over and protruding into the center of castellated plated through hole 2, resulting in what is commonly referred to as a "burr" 3.

The problems associated with burr formation include the potential to dislodge and short circuit the device, interference with inspection of solder joints, contamination of further processing steps, and so on.

Based on the above, there is a need for a new method of creating castellated plated through holes in circuit boards which does not result in burr formation.

SUMMARY OF THE INVENTION

The present invention provides a circuit board that overcomes the above-identified problems of the related art by, in general, pre-profiling the plated through hole, thereby removing the leading edge of the plated through hole to prevent burr free formation during the subsequent profiling operation.

The first general aspect of the present invention provides a method of producing a circuit board having burr free castellated plated through holes, comprising the steps of: providing the circuit board having at least one plated through hole therein; removing a lengthwise portion of the at least one plated through hole; and profiling the at least one plated through hole, leaving a recessed portion at an edge of the circuit board. This aspect allows for the creation of a circuit board having castellated plated through holes at the periphery, without the burr formation associated with conventional methods.

The second general aspect of the present invention provides for a method of producing a burr free castellated plated through hole, comprising the steps of: providing a circuit board having at least one plated through hole therein; removing a lengthwise section of a vertical wall of the at least one plated through hole; and removing a portion of the at least one plated through hole, leaving a recessed portion within an edge of the circuit board. This aspect allows for similar advantages as those associated with the first aspect.

The third general aspect of the present invention provides for a circuit board having at least one burr free castellated plated through hole formed by removing a first portion of an at least one plated through hole, and removing a second portion of the at least one plated through hole, leaving a recessed portion within an edge of the circuit board. This aspect provides a circuit board which allows for similar advantages as those associated with the first aspect.

It is therefore an advantage of the present invention to provide a method of forming burr free castellated plated through holes in the periphery of a circuit board.

It is therefore a further advantage of the present invention to provide conventional circuit boards having castellated plated through holes which have unobstructed inspection joints and provide a reduced risk of shorts.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 3 depicts a prior art profiling tool cutting the leading edge of plated through hole in accordance with conventional methods;

FIG. 4 depicts a prior art castellated plated through hole exhibiting burr formation in accordance with conventional methods;

FIG. 5 depicts a cutting tool placed above a plated through hole in accordance with the present invention;

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment.

FIG. 5 depicts a portion of a circuit board 20, having a plated through hole 22 formed therein. It should be understood that only one plated through hole 22 is shown in circuit board 20 to simplify the description of the present invention. Plated through hole 22 includes inner hole wall 24 and conductive laminate 26. Plated through hole 22 is typically formed in circuit board 20 via drilling, end milling, etc., then plated with a conductive laminate 26, typically copper, or other suitable material, using conventional plating methods.

Figure 1:
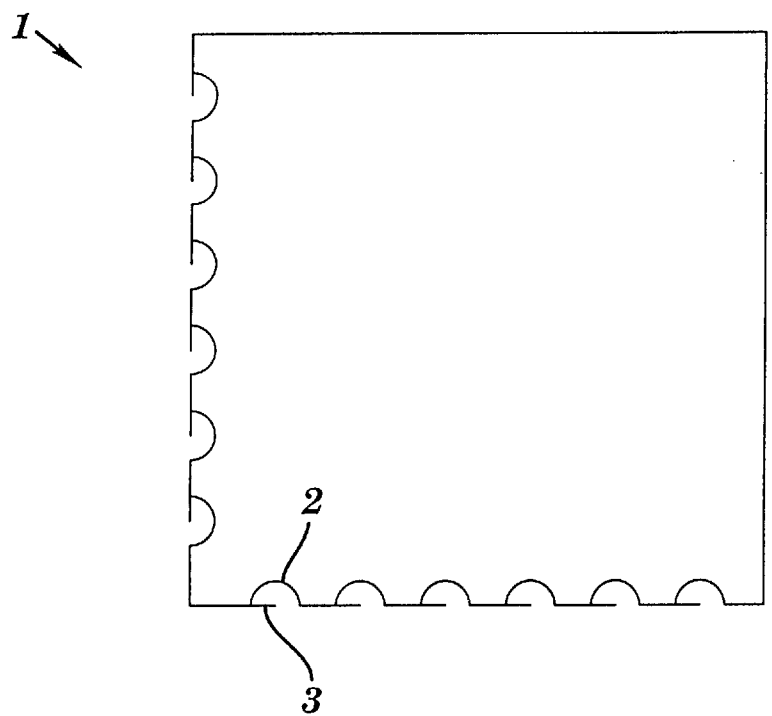
FIG. 1 depicts a portion of a prior art circuit board having burrs protruding into the castellated plated through holes.
Figure 2:
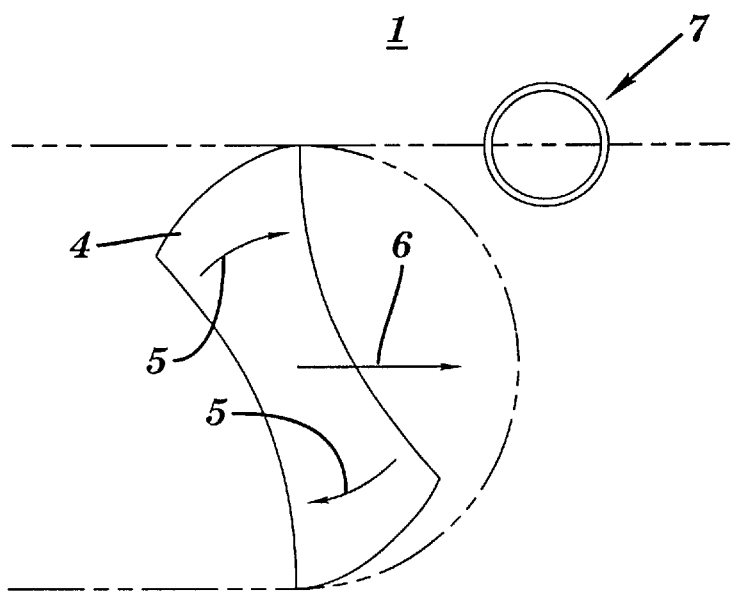
FIG. 2 depicts a prior art profiling tool approaching a plated through hole in accordance with conventional methods.
Figure 6:
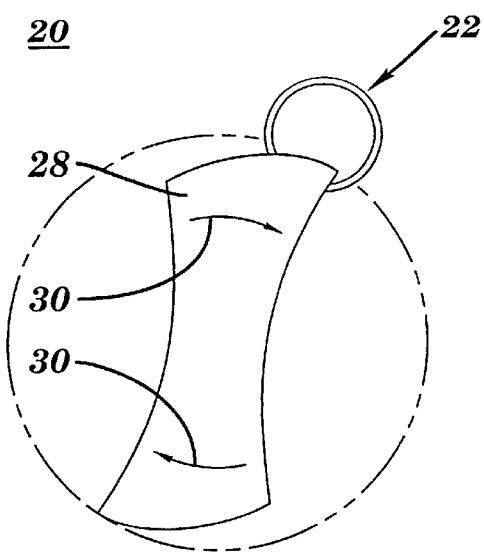
FIG. 6 depicts a pre-profiling operation in accordance with the present invention.
Figure 7:
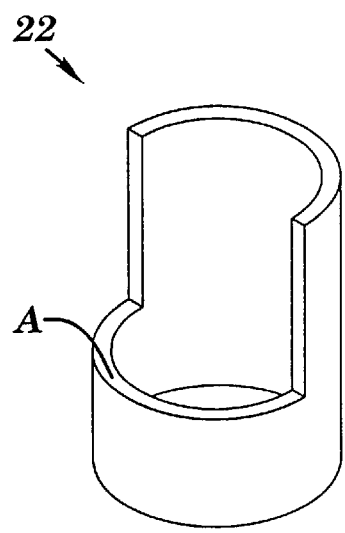
FIG. 7 depicts an isometric view of a plated through hole partially cut to illustrate the direction of pre-profiling in accordance with the present invention.

Cutting tool 28, such as a milling cutter, drill, or other similar tool, rotating in the direction indicated by arrows 30, is positioned vertically over plated through hole 22. As illustrated in FIG. 6, cutting tool 28 is plunged into plated through hole 22. Cutting tool 28 enters plated through hole 22 from a first side of circuit board 20 and exits from the opposite side of circuit board 20. In other words, cutting tool 28 plunges all the way through the thickness of circuit board 20, removing a section of plated through hole along the length of the plated through hole 22. FIG. 7 more clearly illustrates the direction of plunging. In particular, cutting tool 28 is plunged into surface A of plated through hole 22.

Figure 9:
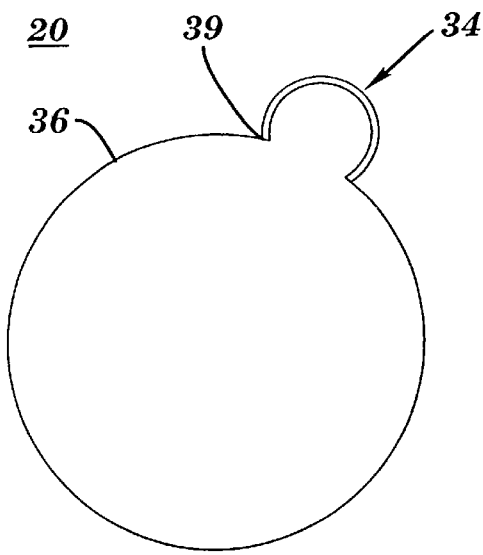
FIG. 9 depicts a pre-profiled plated through hole in accordance with the present invention.
Figure 8:
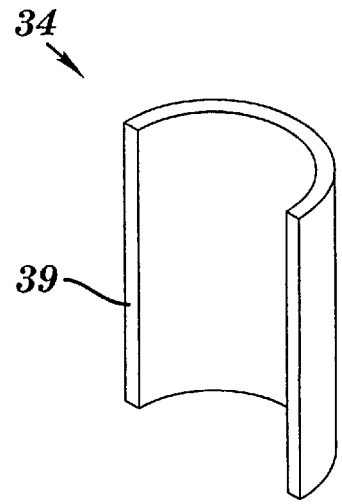
FIG. 8 depicts an isometric view of a plated through hole formed by pre-profiling in accordance with the present invention.

FIG. 8 shows pre-profiled plated through hole 34 having pre-profiled surface 39 produced by cutting tool 28. FIG. 9 further illustrates pre-profiled plated through hole 34 in circuit board 20, having an adjacent hole 36 which is produced by the pre-profiling process.

Figure 10:
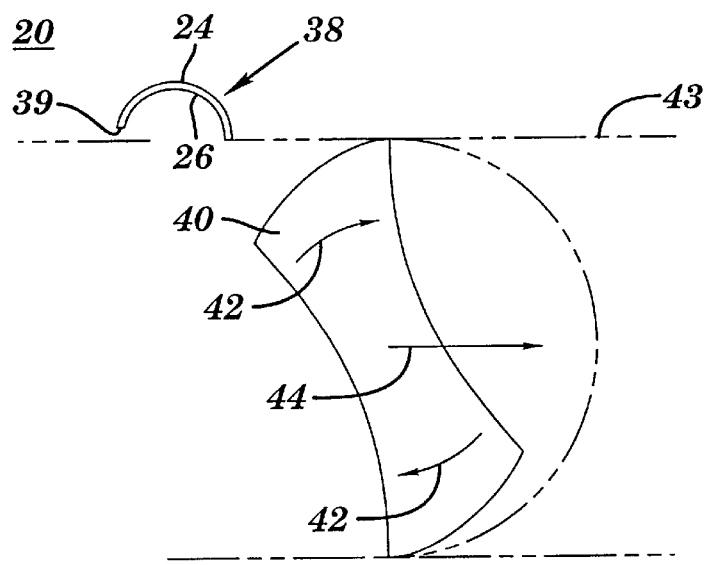
FIG. 10 depicts a castellated plated through hole produced following a subsequent profiling process in accordance with the present invention.
Figure 11:
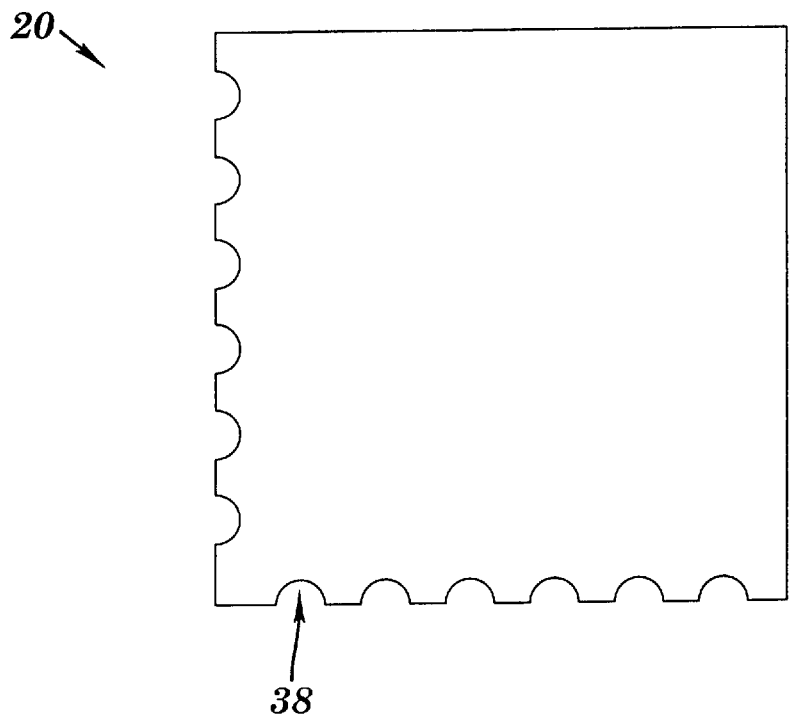
FIG. 11 depicts a portion of a circuit board having burr free castellated plated through holes in accordance with the present invention.

FIG. 10 shows castellated plated through hole 38 after profiling tool 40, such as a milling cutter, or other conventional tool, rotating in the direction indicated by arrows 42 and moving laterally in the direction of arrow 44 along path 43, removes a remaining unwanted portion of pre-profiled plated through hole 34 (refer to FIG. 9). A recessed portion or the castellated plated through hole 38 remains at the periphery of circuit board 20. Path 43 of the profiling operation should be at an off-set distance of about 0.001 to 0.003 inches from pre-profiled edge 39 to ensure conductive laminate 26 is not touched by profiling tool 40 as it passes or else a burr will form regardless of the pre-profiling step. FIG. 11 depicts circuit board 20 produced in accordance with the present invention having burr free castellated plated through holes 38, unlike the prior art.

Removal of a section of plated through hole 22 during the pre-profiling process, thereby creating pre-profiled edge 39, in conjunction with performing the subsequent profiling operation at an off-set distance from pre-profiled edge 39 effectively prevents the burr formation encountered by prior art methods. Specifically, the present invention prevents burr formation by removing the leading edge, via machining, (illustrated in FIG. 3 as leading edge 8) which is typically hit during profiling, and creating pre-profiled edge 39. Since pre-profiled edge 39 is slightly off-set from path 43 of profiling tool 40, pre-profiled edge 39 is not contacted by profiling tool 40 as it passes. Accordingly, conductive laminate 26 is not pulled away from inner hole wall 24 of plated through hole 22 during profiling, as with prior art methods, thereby preventing burr formation.

It should be noted that both pre-profiling and subsequent profiling steps may be performed using the same tool if necessary or desirable.

It should also be appreciated that cutting tool 28 may be applied to either side of circuit board 20 during the preprofiling process.

As an alternative to pre-profiling plated through hole 22 using cutting tool 28, followed by a subsequent profiling process using profiling tool 40, the entire removal process may be performed by a process known as "nibbling." Nibbling is the use of a drilling tool, milling tool, or other appropriate tool, which first plunges all the way through circuit board 20, removing a lengthwise portion of plated through hole 22. Subsequent plunges through the thickness of circuit board 20 are performed to remove the remaining unwanted portions of plated through hole 22, rather than using profiling tool 40. Accordingly, castellated plated through hole 38 having the normal roughness associated with a nibbling process is produced.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A circuit board having at least one annular burr free castellated plated through hole formed by removing a first portion of an at least one plated through hole, and removing a second portion of the at least one plated through hole, leaving a portion of laminate having an edge recessed from a surface of the circuit board.

2. The circuit board of claim 1, wherein an opening within the circuit board, intersecting the plated through hole along a vertical axis of the plated through hole, is formed following the removal of the first portion of the plated through hole.

3. The circuit board of claim 1, wherein following the removal of the second portion of the burr free castellated plated through hole, the burr free castellated plated through hole further comprises:

a first edge of laminate, wherein the first edge of laminate is off-set from the surface of the circuit board; and a second edge of laminate, wherein the second edge of laminate is adjacent the surface of the circuit board.

4. The circuit board of claim 3, wherein the first edge of the laminate within the burr free castellated plated through hole is off-set about 0.001 to 0.003 inches from the surface of the circuit board.

5. The circuit board of claim 1, wherein the laminate comprises copper.

6. The circuit board of claim 1, wherein a cutting tool removes the first portion of the at least one plated through hole.

7. The circuit board of claim 1, wherein a profiling tool removes the second portion of the at least one plated through hole.

8. A circuit board having at least one burr free castellated plated through hole therein comprising:
- a first edge of a laminate within the burr free castellated plated through hole off-set from a surface of the circuit board; and
- a second edge of the laminate adjacent the surface of the circuit board.

9. The circuit board of claim 8, wherein the first edge of the laminate is off-set about 0.001 to 0.003 inches from the surface of the circuit board.

10. The circuit board of claim 8, wherein an opening, formed by removing a first portion of a plated through hole within the circuit board, forms the first edge of the laminate.

11. The circuit board of claim 10, wherein the second edge of the laminate is formed by removing a second portion of the plated through hole.

12. The circuit board of claim 8, wherein the laminate comprises copper.

13. A circuit board having at least one annular burr free castellated plated through hole wherein a first edge of the plated through hole is off-set from a surface of the circuit board.

14. A circuit board having at least one annular burr free castellated plated through hole wherein a first edge of a laminate within the plated through hole is off-set from a surface of the circuit board.

15. A circuit board having a surface adjacent a profiled plated through hole, wherein a first edge of a laminate within the plated through hole is recessed from the surface of the circuit board and a second edge of the laminate within the plated through hole and the surface of the circuit board are substantially coplanar.

* * * * *